United States Patent [19]

Brechard et al.

[11] Patent Number: 4,852,098

[45] Date of Patent: Jul. 25, 1989

[54] POLYNOMIAL OPERATOR IN GALOIS FIELDS AND A DIGITAL SIGNAL PROCESSOR COMPRISING AN OPERATOR OF THIS TYPE

[75] Inventors: Dominique Brechard, Paris; Pierre-Andre Laurent, Bessancourt, both of France

[73] Assignee: Thomson-CSF, Paris, France

[21] Appl. No.: 111,280

[22] Filed: Oct. 22, 1987

[30] Foreign Application Priority Data

Oct. 22, 1986 [FR] France .................. 86 14677

[51] Int. Cl.$^4$ .................................. G06F 11/10
[52] U.S. Cl. .................................. 371/37
[58] Field of Search .................. 371/37, 38, 39, 40

[56] References Cited

U.S. PATENT DOCUMENTS

| | | | |
|---|---|---|---|
| 4,099,160 | 7/1978 | Flagg | 371/37 |
| 4,117,458 | 9/1978 | Burghard et al. | 371/37 |
| 4,162,480 | 7/1979 | Berlekamp | 371/37 |
| 4,165,444 | 8/1979 | Gordon | 371/43 |
| 4,498,175 | 2/1985 | Nagumo et al. | 371/37 |
| 4,527,269 | 7/1985 | Wood et al. | 371/37 |

FOREIGN PATENT DOCUMENTS 0165147 12/1985 European Pat. Off. .

Primary Examiner—Charles E. Atkinson
Attorney, Agent, or Firm—Oblon, Spivak, McClelland, Maier & Neustadt

[57] ABSTRACT

The polynomial operator in the Galois field of the invention is organized at three levels:
a multiplexer level to select and transmit the operands to be used for the successive stage of the calculation to a second level;
a so-called pipeline level comprising 3 flip-flop registers to memorize the operands selected at the first level;
a third level for calculation, comprising a multiplier-adder which has its inputs X, Y and Z connected to the outputs of the registers, and which gives the coefficients of the resultant polynomials in the Galois field while always performing the same calculation by repetition of the same control instruction. This operator can be applied to digital telecommunications for the encoding and decoding of BCH or RS (REED SOLOMON) error-correcting codes, and can be used to make an integrated processor capable of processing digital data in the form of octets.

6 Claims, 8 Drawing Sheets

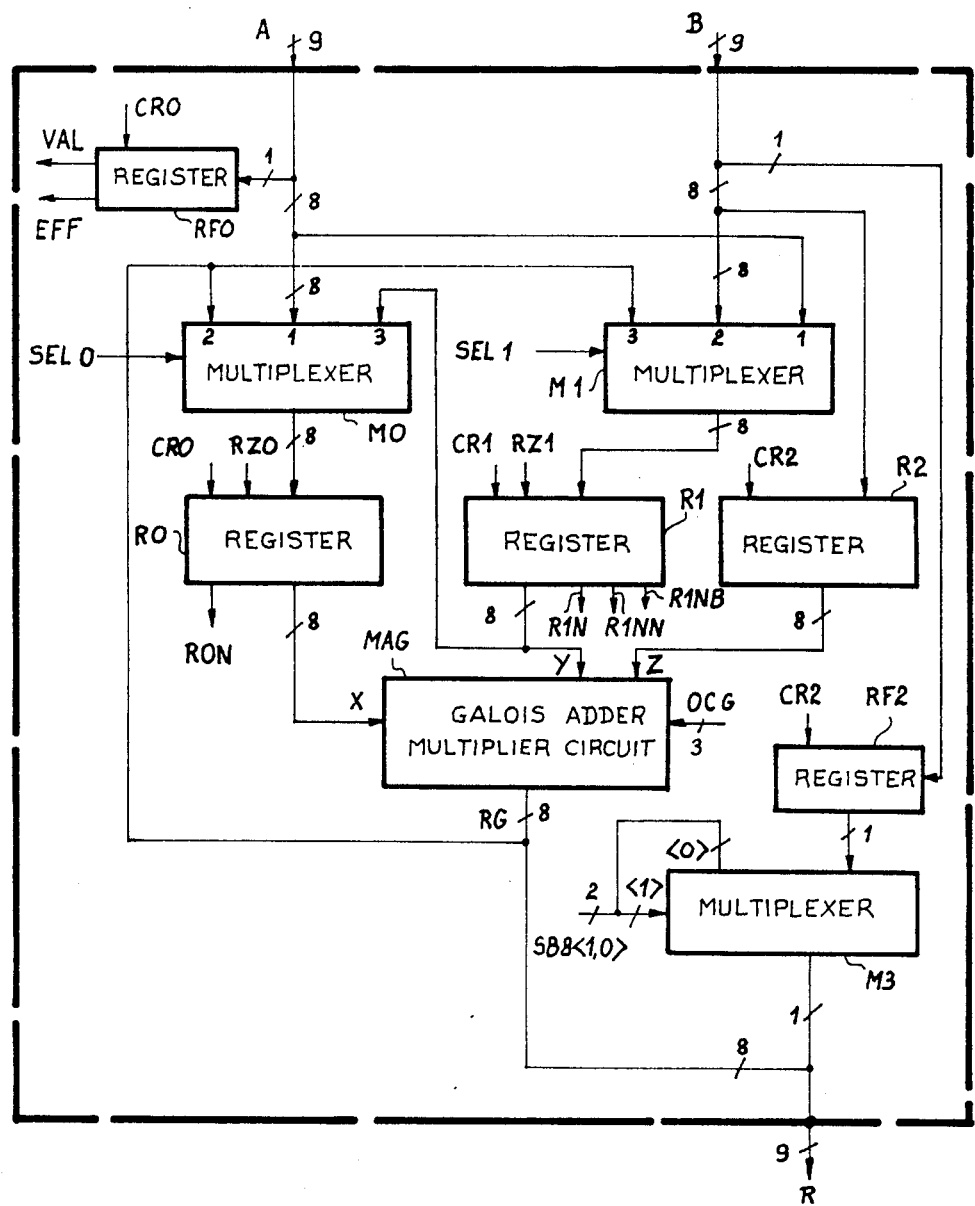
FIG_1

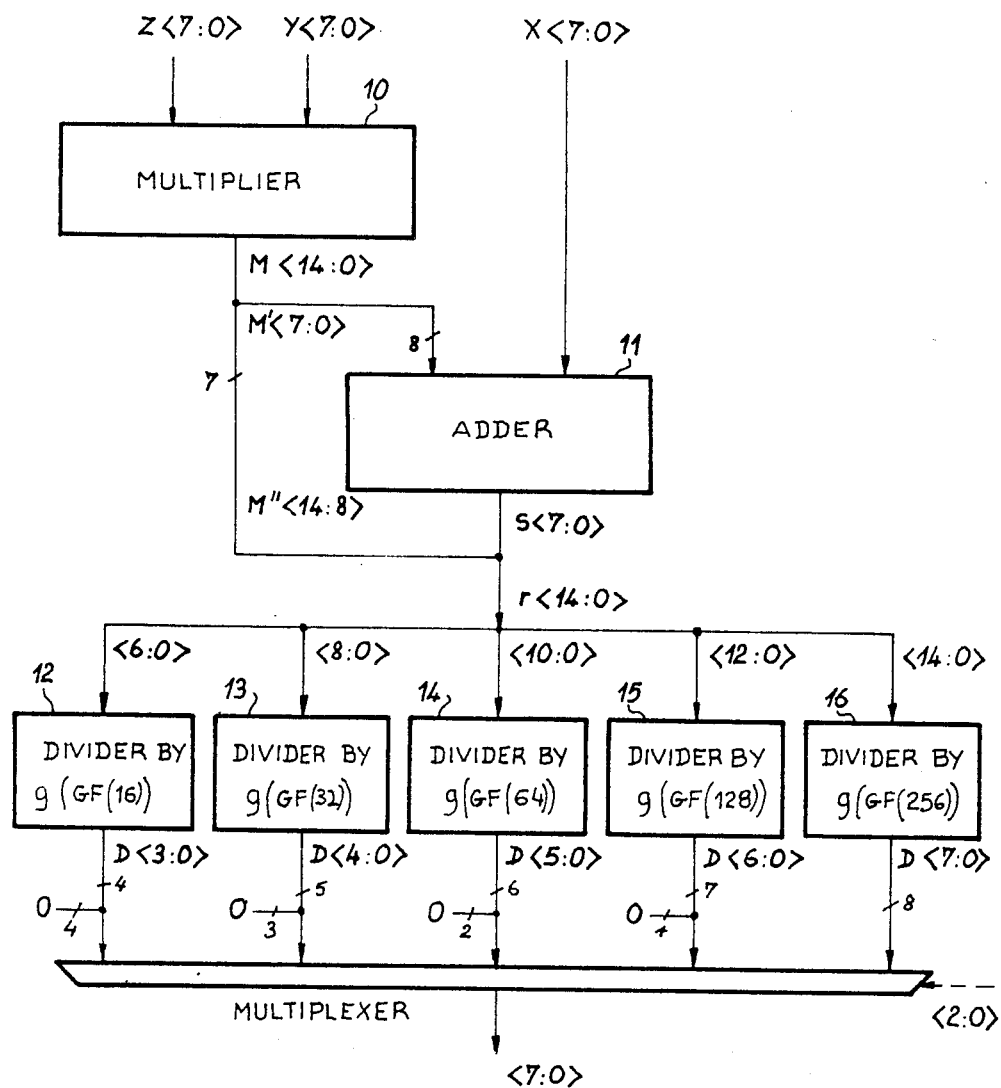
FIG_2

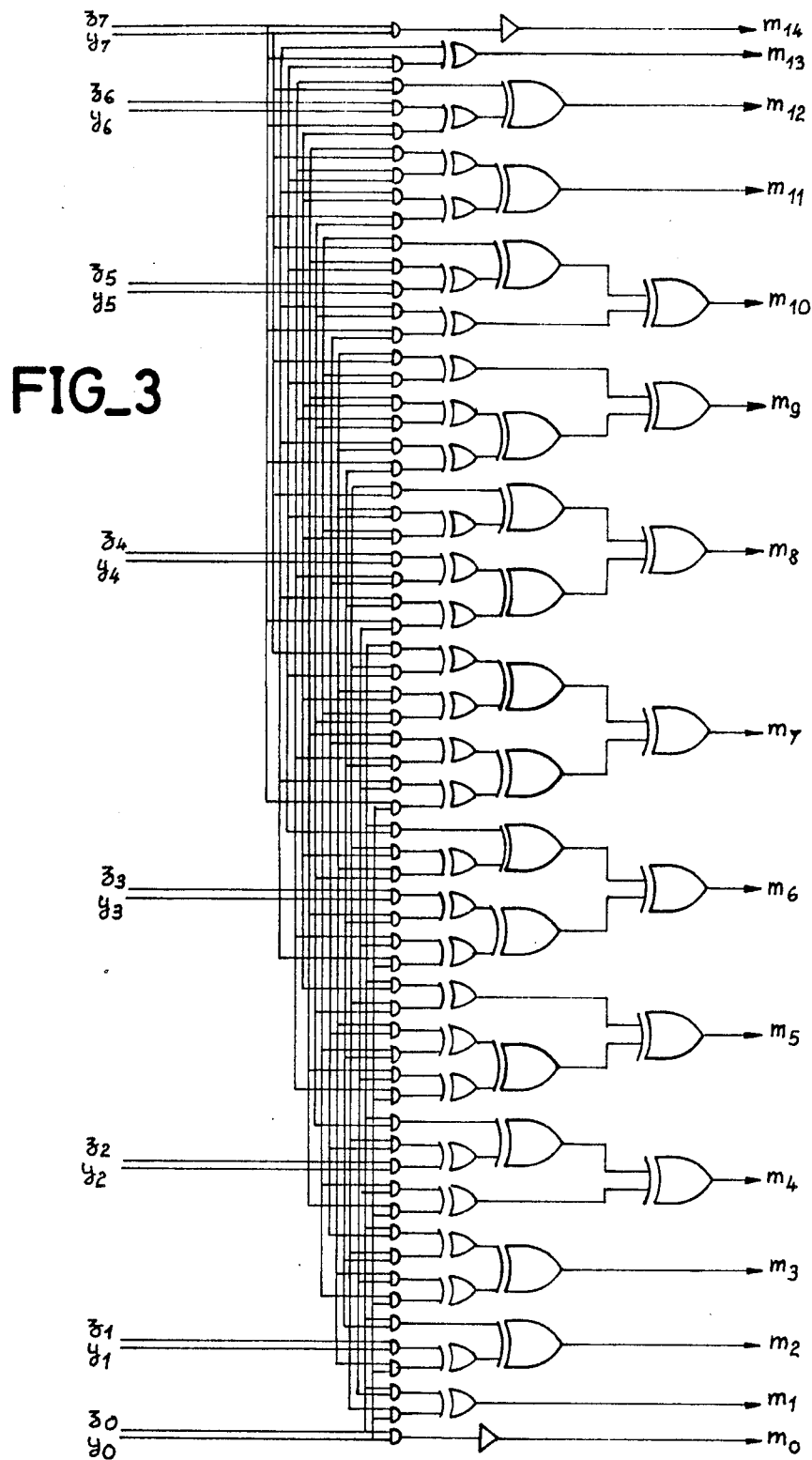
FIG_3

FIG_4
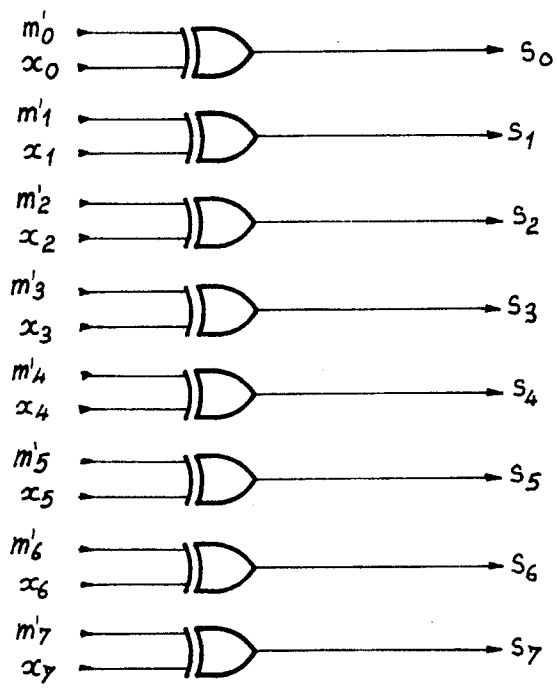
FIG_5
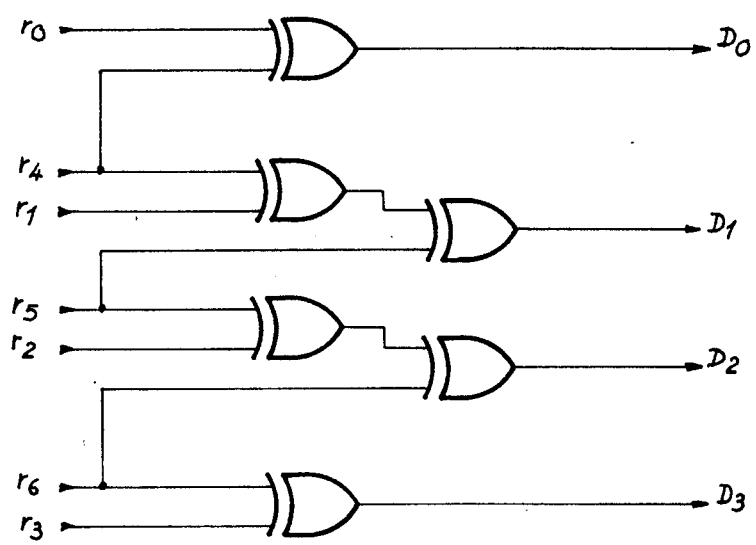

FIG_6
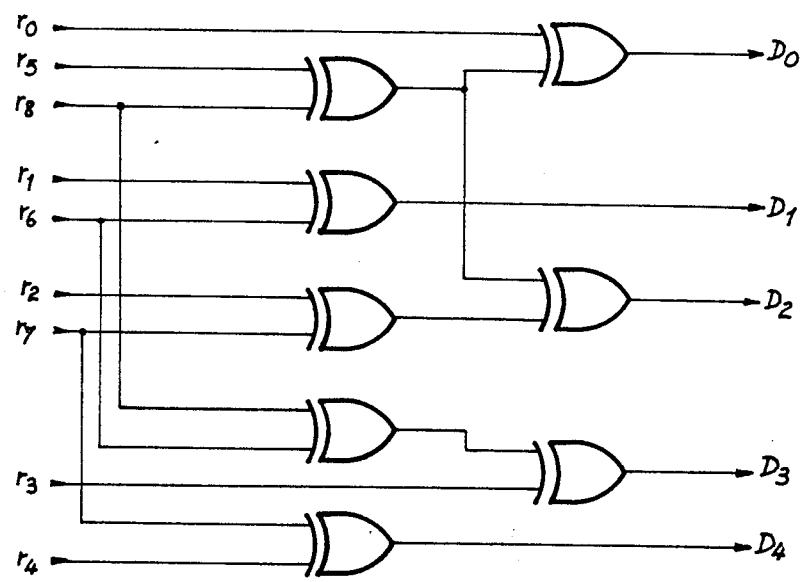
FIG_7
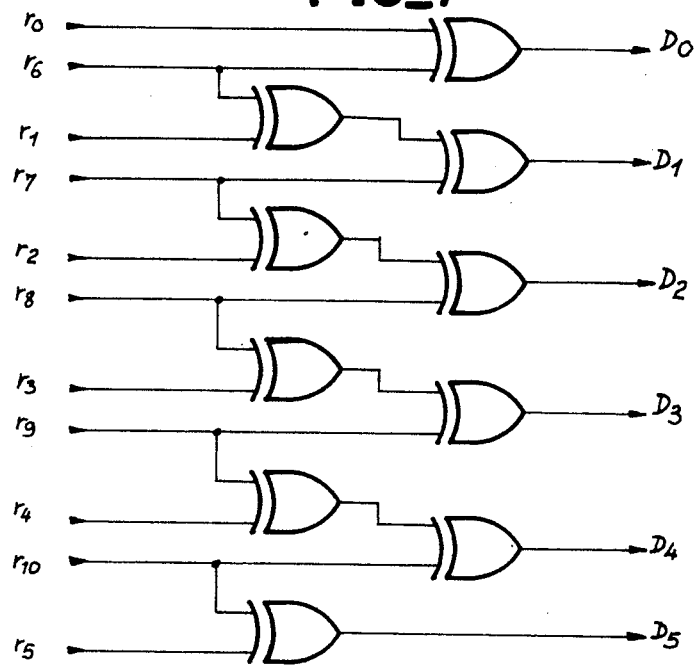

FIG_8
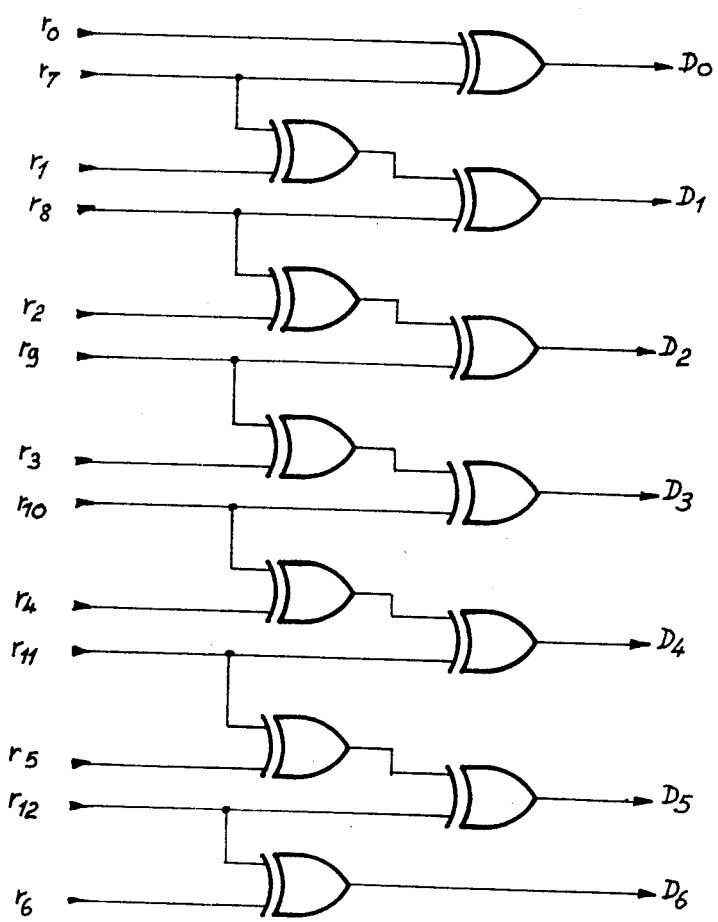

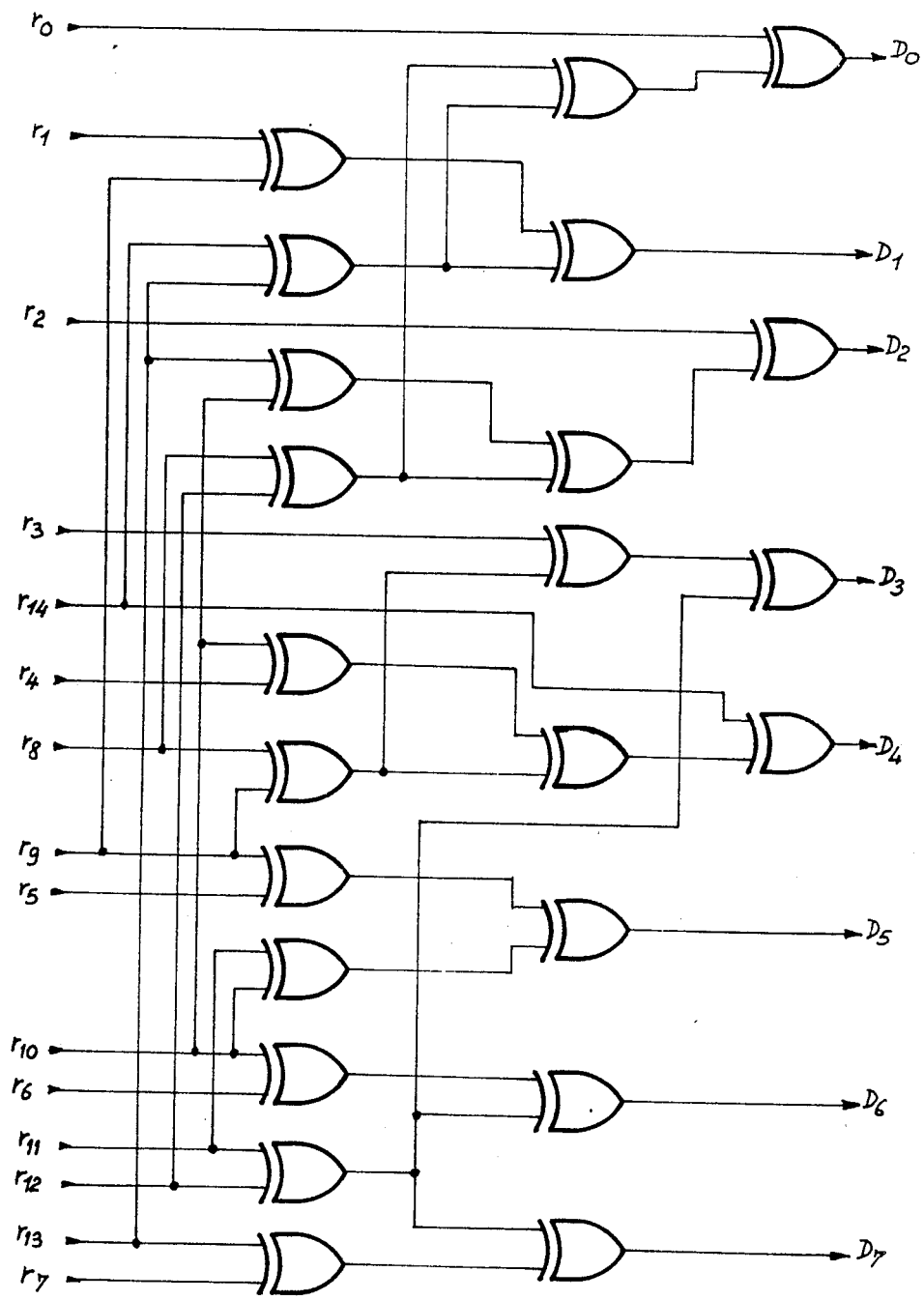
FIG_9

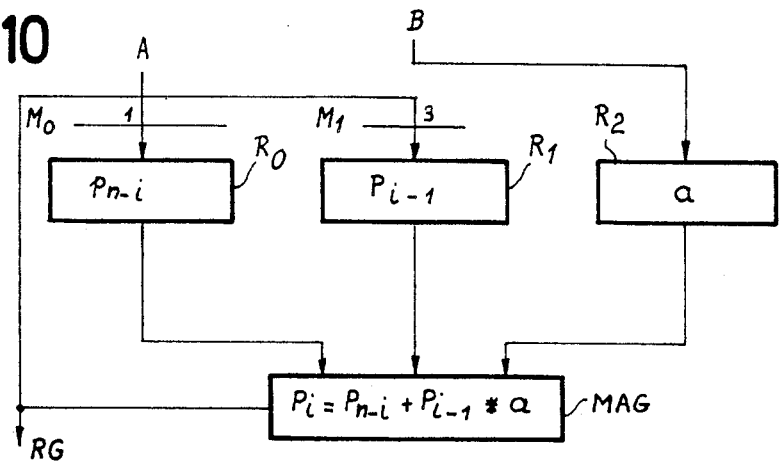
FIG_10
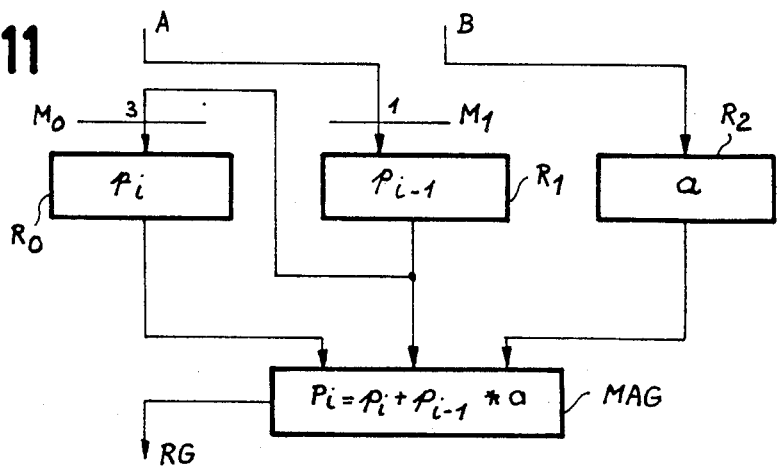
FIG_11
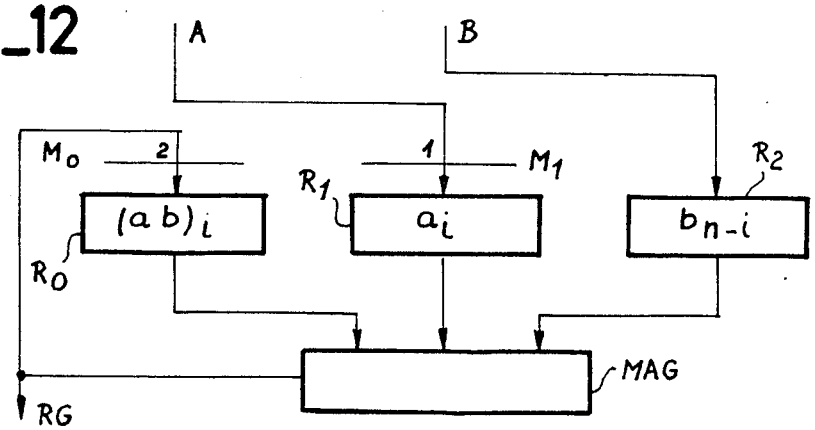
FIG_12

POLYNOMIAL OPERATOR IN GALOIS FIELDS AND A DIGITAL SIGNAL PROCESSOR COMPRISING AN OPERATOR OF THIS TYPE

BACKGROUND OF THE INVENTION

1. Field of the Invention

The invention pertains to the field of digital telecommunications, and more particularly to the processing of the digital signals necessary in this type of application.

Digital telecommunications are subjected to disturbances which are due, among other reasons, to the poor quality of the transmission channel and to action by active jammers. They therefore require data to be protected efficiently.

2. Description of the Prior Art

Conventional methods associating simple error detection and a routine message-repetition procedure are advantageously replaced by the technique of error-correcting codes which introduce redundancy into the digital signals transmitted and give an effective compromise between useful flowrate and the protection of the data transmitted. In all correcting codes, there are two classes of codes in blocks which provide a reasonable balance between complexity of application and efficiency:

BCH codes based on a binary alphabet used especially to correct isolated errors;

REED-SOLOMON (RS) codes, based on an alphabet with M symbols, each having m bits, $M = 2m$. These codes are used to correct packets of errors.

The coding and decoding operation, performed on the digital signal, makes use of the processing of polynomials with values in the Galois fields.

The French patent application No. 84 08141, filed on behalf of the Applicant and entitled "encoder-decoder of codes in blocks which can be parameterized" describes a processor specialized in this type of digital processing, comprising a polynomial operator in Galois fields. This operator performs scalar operations or polynomial operations on the elements of a Galois field chosen from among the Galois fields with 16, 32, 64 or 128 elements, making it possible to perform operations on symbols having $M = 4, 5, 6$ or 7 bits respectively. The operator described in this application cannot be used to process data in the Galois field with 256 elements, GF(256), where the calculations are very complicated but would enable the processing of octets which are the basic symbols in data transmission. Furthermore, the structure of the prior art operator specified above cannot be used to make a fast circuit, even in the most efficient technologies of the present day. Besides, the sequences of the necessary operations can be performed only through sequences of instructions, even for operations of the type entailing the product of a polynomial by a monomial. Finally, this operator does not provide for the masking of processed data, especially for the simple location of errors.

SUMMARY OF THE INVENTION

An object of the invention is a polynomial operator in a Galois field, the organization of which is such that the elementary operations of the type $X + (Y*Z)$, can be performed in all Galois fields with 16 to 256 elements: GF(16), GF(32), GF(64), GF(128), and also GF(256) which making it possible to process octets directly. This operator is organized in such a way that the execution of all the basic polynomial calculations in this type of arithmetic, namely the development of a polynomial, the product or the division of polynomials, can be made by repeating a simple instruction. Furthermore, this operator can easily be integrated on silicon with a small area, the calculating speed obtained being high. Finally, it is also possible in this operator to mask data in a simple way, as will be explained below.

According to the invention, a polynomial operator in Galois fields is organized at three successive levels:

a first level for the selection of operands comprising a multiplexing circuit, with three Galois value outputs;

a so-called "pipeline" level, comprising three memory registers having three multiple inputs connected to the outputs of the multiplexing circuit, to memorize three operands, along with three associated outputs;

a calculating level comprising a Galois field multiplier/adder circuit, the said circuit comprising two multiplier inputs, connected to the outputs of two of the memory registers, one adder input, connected to the output of the third memory register, the multiplier/adder circuit always performing the calculation $X + (Y*Z)$ where $+$ and $*$ represent addition and multiplication in the Galois field, and one result output;

and wherein the inputs of the multiplexing circuit are inputs of operands to receive Galois values from outside the operator, with, in addition, at least one input connected to the output of one of the memory registers, and one input connected to the result output of the multiplier/adder, the selection of the three inputs of the multiplexing circuit being programmed so that the calculating instruction $X + (Y*Z)$ is unchanged regardless of the type of polynomial operation to be performed in the Galois field.

Another object of the invention is a digital signal processor comprising this type of polynomial operator in the Galois field.

BRIEF DESCRIPTION OF THE DRAWINGS

The invention will be better understood and other characteristics will emerge from the following description made with reference to the appended figures, of which:

FIG. 1 is a block diagram of the operator according to the invention;

FIG. 2 is block diagram of the multiplier/adder circuit used in the operator according to the invention;

FIG. 3 is a detailed diagram of the circuit that calculates the product of two binary, polynomials;

FIG. 4 is a detailed diagram of the circuit that performs the addition in the operator;

FIGS. 5, 6, 7, 8 and 9 respectively show the circuits used to carry the results of the polynomial calculations in the Galois field, GF(16), GF(32), GF(64), GF(128) and GF(256) respectively;

FIG. 10 shows the configuration of the Galois operator for the division of a polynomial by a monomial;

FIG. 11 represents the configuration of the Galois operator for the development of a polynomial by a monomial;

FIG. 12 represents the configuration of the Galois operator for the multiplication of two polynomials.

DESCRIPTION OF THE PREFERRED EMBODIMENTS

Generally, the polynomial operator in the Galois fields according to the invention has two inputs, A and B, for the operands, and one output R for the results.

These three elements have, at the most, nine significant bits 0 to 8. The polynomial data consist of an organized sequence of coefficients, each of which has 9 bits at the most. Each coefficient consists of one value in the Galois field corresponding, at the most, to the eight least significant bits 8LSB, and of one validity bit on the most significant bit MSB. The circuits for processing these two types of data are unconnected.

First of all, the Galois values processing circuit, which uses the sequences of Galois values applied to one and/or the other of the two operand inputs A and B, is organized at three levels in the following way:

A first level, called the operands selection level, comprising two multiplexers $M_0$ and $M_1$, controlled by selection signals, SEL0 and SEL1. These multiplexers M0 and M1 respectively have three multiple inputs on eight bits and one output on eight bits. The multiplexers M0 and M1 have a first input 1 connected to the operand input A; the multiplexer M1 has a second input 2 connected to the operand input B; the third input 3 of the multiplexer M1 and the second input 2 of the multiplexer M0 are connected to the Galois result output GR of the operator defined below; the third input 3 of the multiplexer M0 is connected to the output of a register R1 located at the second level and described below.

In one embodiment of the operator, the selection signals applied to the multiplexers may be three-bit signals, with only one being active and determining the input of the multiplexer to be connected to its output.

If the order numbers of the significant bits are noted between brackets, the operand source can be selected, via the multiplexer M0, as follows:

| Active bit | Selected input = M0 output | |
|---|---|---|
| SEL0 <0> | 1: Operand A | <7...0> |
| SEL0 <1> | 2 : Result GR | <7...0> |
| SEL0 <0> | 3 : Register R$_1$ | <7...0> |

The selection by the multiplexer M1 may be as follows:

| Active bit | Selected input = M1 output | |
|---|---|---|
| SEL1 <0> | 1: Operand A | <7...0> |
| SEL2 <1> | 2: Operand B | <7...0> |
| SEL3 <2> | 3: Result GR | <7...0> |

A second level, known as a "pipeline" level, comprising three registers of eight D type flip-flops, R0, R1 and R2. The first flip-flop register R0 is connected to the output of the multiplexer M0. In the same way, the second D type flip-flops register, R1, is connected to the output of the multiplexer M1. Finally, the third flip-flops register R2 is directly connected to the operand B input. Each register R0, R1, R2 comprises a loading control input, namely the signals CR0, CR1, CR2, which are active on their rising edges. The registers R0 and R1 further comprise a zero-setting input, namely the signals RZ0 and RZ1, which are also active on their rising edges. The registers R0 and R1 also have status outputs: one output RON for the register R0, the said output RON indicating, when active, that the content of this register is nil, and three status outputs R1N, R1NN and R1NB for the register R1 which, when they are active, indicate respectively that the content of the register R1 is nil, not nil or non-binary. The corresponding status bits are used during the interpretation of the results.

A third level, which is the level at which the calculations (additions and multiplications), needed for the polynomial operations are made. For this, the operator comprises a Galois field multiplier/adder circuit MAG which has three multiple inputs on eight bits, X, Y and Z, respectively connected to the outputs of the three flip-flop registers R0, R1 and R2. The input X connected to the register R0 is an adder input while the two inputs Y and Z, connected to the outputs of the flip-flop registers R1 and R2, are multiplier inputs. A detailed diagram of this multiplier/adder in the Galois fields will be given below with reference to FIG. 2. The multiple output of this circuit on eight bits gives the Galois value GR corresponding to the result of the polynomial operation in the Galois fields. It is this output that is connected to the third input of the multiplexer MO. The multiplier/adder in the Galois fields performs the operation $X+(Y\times Z)=GR$ in the Galois field considered. The parameter OGF (associated with the order of the Galois field 4, 5, 6, 7 or 8) on three bits, in which the operation has to be performed, is applied to the multiplier/adder circuit MAG in such a way that the configuration of the multiplier/adder used corresponds to the Galois field in which the polynomial operation must be performed as will be explained in greater detail below with reference to FIG. 2. The three operands X, Y and Z, which are the contents of the registers R0, R1 nd R2, must imperatively comprise a number of least-significant bits strictly equal to the order of the Galois field in parametric representation. For, if only one of the most significant bits of one of the three values is not nil, the result obtained is without significance.

In one embodiment of the operator, the Galois values and the control signals may be as follows:

The order of the Galois field, a three-bit parameter which fixes the configuration of the operator, may be:

| OGF | Galois field | Degree of generating polynomial | Registration of data in R0, R1, R2 |
|---|---|---|---|
| 011 | GF(16) | 4 | 0000XXXX |
| 100 | GF(32) | 5 | 000XXXXX |
| 101 | GF(64) | 6 | 00XXXXXX |
| 110 | GF(128) | 7 | 0XXXXXXX |
| 111 | GF(256) | 8 | XXXXXXXX |

For the registration of the binary bits, the signs "X" indicates the position of the significant bits, the other bits being necessarily nil.

In addition to the elements described above for the processing of Galois values, the polynomial operator according to the invention also comprises a validity bit processing part. This circuit has two registers with one flip-flop, RF0 and RF2. The loading of these two registers is controlled by the same signals CR0 and CR2 as the registers R0 and R2. These registers memorize the most significant bit (level 8) of the inputs A and B. The flip-flop RF0 generates two status signals EFF and VAL, respectively active when RF0 is at 1 and 0 and characteristic of erasure or, on the contrary, validity. The flip-flop RF2 has its output connected to the first input of a multiplexer M2. This multiplexer M2 also receives a two-bit selection signal, SV8<1,0> to select a validity bit: the first bit SB8<0> is applied to the second input of the multiplexer and can assume the value 0 or 1, the second bit SB8<1> applied to the control input of the multiplexer M3 can be used to select either of the two inputs of the multiplexer in the following way:

| SB8<1,0> | | |
|---|---|---|
| SB8<1> | SB8<8> | Output M3 |
| 0 | 0 | 0 |
| 0 | 1 | 1 |
| 0 | 0 or 1 | RF2 |

This validity bit assigned to the result GR coming from the multiplier/adder in the Galois fields gives a result R<8..0> on nine bits.

FIG. 2 is the block diagram of the Galois field multiplier/adder circuit which can be parameterized according to the order of the Galois field. As indicated above, this circuit comprises three multiple inputs which are respectively connected to the outputs of the registers R0, R1 and R2. The outputs Y and Z of the registers R1 and R2 are connected to the inputs of a multiplier 10 which obtains all the products, two by two, of the coefficients of the polynomials in the Galois fields, i.e. all the $y_i \cdot z_j$ for i ranging between 0 and 7 and j also ranging between 0 and 7. The result that comes from this multiplier is a number M<14...0> with fifteen significant bits, 0 to 14 maximum, when the values processed are values in the Galois field with 256 elements, each on eight bits. The eight least significant bits M'<7...0> are added in a Galois adder 11 to the eight bits X<7...0> at the output of the register R0. The result that comes from the adder S<7...0> is available on eight bits which are the eight least significant bits, of an intermediate result on fifteen bits, of which the seven most significant bits M'<14...8> are available at the output of the multiplier. The intermediate result r<14...0> is carried by equivalence into the same Galois field as the one selected. For this, the Galois multiplier/adder, capable of being parameterized, comprises five circuits, respectively associated with the five useful Galois fields, which are respectively 12 for the 16-element Galois field, 13 for the 32-element Galois field, 14 for the 64-element Galois field, 15 for the 128-element Galois field and 16 for the 256-element Galois field to which are added, respectively, 7, 9, 11, 13 and 15 significant bits of the intermediate result, depending on the field to which the Galois values belong at the outset. Each of these circuits divides the polynomial with a maximum of 15 coefficients, applied to its input, by the polynomial generator of the corresponding Galois field. Depending on the order of the Galois field, the result comprises a certain number of significant bits as shown in the data framing table indicated above: four for the Galois field modulo 16, five for the Galois field with 32 elements ... eight for the Galois field with 256 elements. To reach a result on 8 bits, the most significant bits are positioned at 0. The results given by these various circuits 12 to 16 are transmitted to the inputs of a multiplexer controlled by a three-bit word OGF which can be used to select the output of one of these circuits to give the result on eight bits.

FIG. 3 is a detailed diagram of the multiplier 10 of FIG. 2 by which, using all the coefficients $y_i$ with (i=0 to 7) and $z_j$ (j=0 to 7), it is possible to calculate the products $y_i \cdot z_j$ and the sum according to groups of terms for which i+j= constant: thus the coefficient $m_0$ of M<14...0> is equal to $y_0 \cdot z_0$, the coefficient $m_1$ is equal to $y_1 \cdot z_0 + y_0 \cdot z_1$, etc and
$m_8 = y_1 z_7 + y_2 z_6 + y_3 z_5 + y_4 z_4 + y_5 z_3 + y_6 z_2 + y_7 z_1 \ldots$
and $m_{14} = y_7 z_7$.

As shown in FIG. 3, these logic operations are performed using 64 AND gates, 2 inverters and 49 OR-exclusive gates which can be made on 4 logic layers during the integration.

FIG. 4 shows a detailed diagram of the Galois adder 11 of FIG. 2. This adder combines bits of the same level on the OR-exclusive gates to give the output result of the adder on the same number of bits, i.e. a maximum of 8, S<7...0>.

FIG. 5 represents the module 12 of FIG. 2 which divides the polynomial available at the output of the adder by the generator polynomial of the Galois field with 16 elements, namely $g(GF(16)) = X^4 + X + 1$. This circuit is made with 6 OR-exclusive gates which combine the input bits r<6...0> in the following way:

$D_0 = r_0 + r_4; D_1 = r_1 + r_4 + r_5;$ $D_2 = r_2 + r_5 + r_6; D_3 = r_3 + r_6.$

In the same way, FIG. 6 shows a detailed diagram of the circuit 13 which can be used to carry the polynomial available at its input to the equivalent polynomial in the Galois field with 32 elements through division by the generator polynomial $g(GF(32)) = X^5 + X^2 + 1$. This circuit is made, in the embodiment shown, with eight OR-exclusive gates which combine the input bits r<8...0> in the following way:

$D_0 = r_0 + r_5 + r_8; D_1 = r_1 + r_6;$ $D_2 = r_2 + r_5 + r_8; D_3 = r_3 + r_6 + R_8;$ $D_4 = r_4 + r_7.$

In the same way, the circuit shown in FIG. 7 is a detailed diagram of the circuit 14 of FIG. 2 which can be used to carry the polynomial at its input to the equivalent polynomial in the Galois field with 64 elements through division by the generator polynomial of this field which is $g(GF(64)) = X^6 + X + 1$. This circuit is made using ten OR-exclusive gates which combine the input bits r<10...0> in the following way:

$D_0 = r_0 + r_6; D_1 = r_1 + r_6 + r_7;$ $D_2 = r_2 + r_7 + r_8; D_3 = r_3 + r_8 + R_9;$ $D_4 = r_4 + r_9 + r_{10}; D_5 = r_5 + r_{10}.$

In the same way, the circuit shown in FIG. 8 represents the circuit 15 of FIG. 2 which can be used to carry the polynomial applied at its input to the equivalent polynomial in the Galois field with 128 elements through division by the generator polynomial $g(GF(128)) = X^7 + X + 1$. This circuit is made by means of twelve OR-exclusive gates which combine the input bits r<...0> in the following way:

$D_0 = r_0 + r_7; D_1 = r_1 + r_7 + r_8;$ $D_2 = r_2 + r_8 + r_9; D_3 = r_3 + r_9 + r_{10};$

-continued $$D_4 = r_4 + r_{10} + r_{11}; D_5 = r_5 + r_{12} + r_{11};$$

$$D_6 = r_6 + r_{12}.$$

Finally, the circuit represented in FIG. 9 is a detailed diagram of the circuit 16 of FIG. 2. It can be used to convert the polynomial applied at its input into the equivalent polynomial in the same 256-bit Galois field, through division by the generator polynomial $g(GF(256))=x^8+x^4+x^3+x^2+1$. This circuit is made with 23 OR-exclusive gates which combine the input bits r<14 ... 0> in the following way:

$$D_0 = r_0 + r_8 + r_{12} + r_{14}; D_1 = r_1 + r_9 + r_{13} + r_{14};$$

$$D_2 = r_2 + r_8 + r_{10} + r_{12} + r_{13}; D_3 = r_3 + r_8 + r_9 + r_{11} + r_{12};$$

$$D_4 = r_4 + r_9 + r_{10} + r_{14}; D_5 = r_5 + r_9 + r_{10} + r_{11};$$

$$D_6 = r_6 + r_{10} + r_{11} + r_{12}; D_7 = r_7 + r_{11} + r_{12}.$$

Thus, the maximum number of layers needed to make this Galois multiplier/adder circuit, capable of being parameterized, is 7 layers. In all, to make the Galois operator in VLSI, taking into account the operand input selection levels and the pipeline register levels, a structure of about 10 layers is needed.

The following description, which deals more particularly with the functioning of the circuit described precisely above, will show that this operator structure can be used, quite simply, to perform all the basic polynomial operations for the encoding and decoding operations needed for digital transmissions: the repetition of one and the same instruction controlling the calculation $X+Y\times Z$ can be used to perform all the polynomial operations with an initialization, and then by iteration. FIGS. 10, 11 and 12 represent the core of the operator, i.e. the multiplexers M0 and M1, the registers R0, R1, R2 and the multipliers/adders with only the connections through which the flow of data passes, in three examples of configurations covering virtually all useful polynomial operations.

In FIG. 10, the polynomial operation performed is the division of a polynomial P(z) by (z+a), (z+a), being equal to (z−a) in the Galois field, with the final result corresponding to the value of the polynomial P(z) at the point z=a. In this configuration, the register R1 is zeroized and the register R2 is loaded, in an initializing stage, with the value to be applied to the operand input B through the activation of the loading input CR2. Then the coefficients of the polynomial B (z) are successively applied in descending order to the input A. They are successively transmitted to the register R0, the multiplexer being controlled so that its input 1 is connected to its output, and the result GR at each step of the calculation is applied to the register R1, the multiplexer M1 being controlled so that its input 3 is connected to its output. This operation is made by the so-called HORNER iteration: if the polynomial $$P(z)=P_n z^n + P_{n-1} z^{n-1} + \ldots + P_i z^i + \ldots P_1 z + P_1 z P^0,$$

For which it is sought to calculate the value for z=a, "a" being memorized in the register R2 and the coefficients $p_i$ with i equals 0, being applied successively to the register R0, the successive stages execute the following operations by repetition of the same instruction:

$$P_o = p_n + (a \times 0) = p_n$$

$$P_1 = p_{n-1} + (a \times P_o) = p_{n-1} + ap_n$$

$$P_2 = p_{n-2} + (a \times P_1) = p_{n-2} = ap_{n-1} + a^2 p_n \ldots$$

$$P_i = p_{n-i} + (a \times P_{i-1}) = p_{n-i} + ap_{n-i} + \ldots a^i p_n \ldots$$

$$P_{n-1} = p_1 + (a \times P_{n-2}) = p_1 + ap_2 + \ldots ap_1 + \ldots a^{n-1} p_n$$

$$P_n = p_o + (a \times P_{n-1}) = p_o + ap_1 + a^2 p_2 +$$

$$\ldots a^i p_i + \ldots + a^n p_n$$

The intermediate results pi are the coefficients of the polynomial which is the quotient of the division of P(z) by (z+a). Calculating the value of a polynomial at one point (z=a) amounts to calculating the rest of the division by the monomial for which the root is the point in question. In the decoding methods, the calculation of the final remainder $P_n$ can be used to calculate a syndrome if there is an error present in a received code word.

In the configuration shown in FIG. 11, the Galois operator can be used to develop a polynomial H(z) by the monomial (1+az). As in the preceding case, the register R2 is initially charged by the value and the register R1 is zeroized, the register R0 being initially at any status. The coefficients of the polynomial P(z) are applied according to ascending order to either one of the inputs A and B, these coefficients being introduced successively into the register R1 either through the input 1 of the multiplexer M1 (as shown in FIG. 11) or through the input 2 of this same multiplexer. The register R0 is loaded, through the input 3 of the multiplexer MO, by the content of the register R1, i.e. at a given instant, the register R0 comprises the coefficient $p_{i-1}$ and the register R1 comprises the coefficient $p_i$ and the register R2 comprises the value The result coming from the multiplier/adder gives the coefficients $p_i$ of the polynomial p(z) (1+az) successively in ascending order.

For a development of the polynomial P(z) by (a+z), the same configuration is used, but the coefficients of P(z) are entered at A or B no longer in ascending order but in descending order (and with a constant of proportionality).

The configuration of the Galois operator shown in FIG. 12 can be used to calculate the coefficients of the product of two polynomials $A(z)=a_o+a_1 z+a_2 z^2+ \ldots a_i z^i + \ldots +a_n z^n$ and $B(z)=b_o+b_1 z+b_2 z^2+ \ldots b_i z^i+ \ldots b_n z^n b_n z^n$ where the coefficients are applied respectively to the inputs A and B. The coefficients of B(z) are applied successively to the register R2. The coefficients of the polynomial A(z) are applied to the register R1 through the input 1 of the multiplexer M1, and the result output of the multiplier/adder is connected to the register R0 through the input 2 of the multiplexer MO. The multiplier calculates the products $a_i*b_j$; the coefficients ai and bj are presented at the inputs A and B, and the zeroizing of the registers are controlled in such a way that the coefficients ai and bi for i and j variable, such as i+j=constant, are accumulated, the coefficient of the level i+j being taken into consideration when all the possible products such as i=j=constant are exhausted.

The coefficients of the polynomials A(z) and B(z), needed to calculate a coefficient of a level different from the product, are then presented again at the operand inputs.

The succession of stages may be as follows:

$a_o * b = (ab)_o$ zeroizing of the register R0.

$0 + (a_o * b_1)$ $|a_o * b_1| + (a_1 * b_o) = (ab)_1$ zeroizing of the register R0.

$0 + (a_o * b_2)$ $|a_o * b_2| + (a_2 * b_o)$ $|(a_o * b_2) + (a_1 * b_1)| + (a_2 * b_o)$ $|(a_o * b_2) + (a_1 * b_1) + (a_2 * b_o)| = (ab)_2$ zeroizing of the register RP . . . etc.

As indicted above, it is always the same instruction $X(+Y*Z)$ that is used for the calculation and the sequence of the intermediate results gives the sequence of the coefficients of the polynomial produced.

These different polynomial operations are the ones currently used in the encoding and decoding algorithms of error-correcting codes of the BCH or REED SOLOMON type.

For example, as indicated above, the polynomial operation $P(z)/(z+a)$ can be used to calculate each syndrome during the decoding process for the detection of errors. This operation is also used in a encoding algorithm of the REED SOLOMON type.

The operation $P(z)(1+az)$ can also be used in the REED SOLOMON encoding algorithms to calculate the inverse polynomial of the code-generating polynomial. It can also be used in the decoding of a code word comprising erasing data to create an erasure locating polynomial associated with this word.

The product of two polynomials may be used during encoding to calculate the redundancy bits to be added to the bits forming the data, by the convolution of the data word and the inverse generator polynomial of the code.

Practically all the operations used in the encoding and decoding algorithms can be performed by the operator described above, and by the repetition of one and the same calculation instruction.

FIGS. 3 to 9 represent an embodiment which can be modified. This special mode can be used, however, to make the operator in a VLSI silicon circuit with 9 or 10 active layers, i.e. by establishing a suitable compromise between speed and complexity.

What is claimed is:

1. A polynomial operator in Galois fields organized at three successive levels:
   a first level for the selection of operands comprising a multiplexing circuit, with three Balois value outputs;
   a so-called "pipeline" level, comprising three memory registers having three multiple inputs connected to the outputs of the multiplexing circuit, to memorize three operands, along with three associated outputs;
   and a calculating level comprising a multiplier/adder circuit in said Galois fields, the said circuit comprising two multiplier inputs, connected to the outputs of two of the memory registers, one adder input, connected to the output of the third memory register, the multiplier/adder circuit always performing the calculation $X+(Y\times Z)$ where $+$ and $\times$ represent addition and multiplication in said Galois fields, said multiplier/adder circuit outputting a result output;
   and wherein the inputs of the multiplexing circuit are inputs of operands to receive Galois values from outside the operator, with, in addition, at least one input connected to the output of one of the memory registers, and one input connected to the result output of the multiplier/adder, the selection of one of the three inputs of the multiplexing circuit being programmed so that the calculating instruction $X+(Y\times Z)$ is unchanged regardless of the type of polynomial operation to be performed in a particular Galois field.

2. An operator according to claim 1, wherein:
   the multiplexing circuit has two inputs of operands, the first register being always fed by the same operand input, a second register being fed by either of the operand inputs or by the result output via a multiplexer, the third register being fed by an operand input through the result output or through the output of the second register.

3. An operator according to claim 1, wherein:
   since each operand Galois value at the input of the operator is allocated an additional validity bit, the operator further comprises a processing circuit for validity bits, having one-bit memories associated with each of the validity bits of the input operands, control inputs and an output giving the validity bit to be assigned to the result output of the multiplier-adder to form the result output available at the output of the operator.

4. An operator according to claim 1, wherein:
   in processing Galois values in one of the five Galois fields with 16, 32, 64, 128 or 256 elements, respectively comprising elements with 4, 5, 6, 7 or 8 significant bits, the multiplier-adder circuit has 5 circuits for the division of the result obtained from a maximum of 15 bits, respectively by the generator polynomials of these field to carry the results to the equivalent Galois values having a maximum of 8 bits.

5. An operator according to claim 1, wherein: a resultant integrated structure having at least 9 active layers as made by VLSI technology.

6. An operator according to claim 1 wherein:
   a digital signal processor capable of being parameterized encodes and/or decodes BCH and REED SOLOMON error correcting and detecting codes.

* * * * *